(12) United States Patent
Frach et al.

(10) Patent No.: US 8,164,063 B2
(45) Date of Patent: Apr. 24, 2012

(54) TIME OF FLIGHT MEASUREMENTS IN POSITRON EMISSION TOMOGRAPHY

(75) Inventors: Thomas Frach, Aachen (DE); Torsten Solf, Aachen (DE); Andreas Thon, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 643 days.

(21) Appl. No.: 12/375,413

(22) PCT Filed: Jul. 18, 2007

(86) PCT No.: PCT/US2007/073738
§ 371 (c)(1),
(2), (4) Date: Jan. 28, 2009

(87) PCT Pub. No.: WO2008/079445
PCT Pub. Date: Jul. 3, 2008

(65) Prior Publication Data
US 2009/0236532 A1 Sep. 24, 2009

Related U.S. Application Data

(60) Provisional application No. 60/820,615, filed on Jul. 28, 2006.

(51) Int. Cl.
*G01T 1/166* (2006.01)
*G01T 1/20* (2006.01)
(52) U.S. Cl. .................... 250/363.04; 250/369
(58) Field of Classification Search ............. 250/363.03, 250/363.04, 367, 390.01, 390.11, 362, 369
See application file for complete search history.

(56) References Cited

U.S. PATENT DOCUMENTS

| 5,591,967 | A | 1/1997 | Moake |
| 6,118,390 | A | 9/2000 | Chen et al. |
| 6,288,587 | B1 | 9/2001 | Chen et al. |
| 2003/0062482 | A1* | 4/2003 | Williams et al. ......... 250/363.03 |
| 2005/0211893 | A1 | 9/2005 | Paschalidis |
| 2007/0131866 | A1* | 6/2007 | Srivastava et al. ............ 250/367 |

FOREIGN PATENT DOCUMENTS

WO 2006017544 A2 2/2006

OTHER PUBLICATIONS

Jackson, J. C., et al.; Towards integrated single photon counting microarrays; 2003; Optical Engineering; 42(1) 112-118.
Otte, A. N., et al.; A test of silicon photomultipliers as readout for PET; 2005; Nuclear Instruments and Methods in Physics Research A; 545:705-715.
Stewart, A. G., et al.; Study of the Properties of New SPM Detectors; 2006; Proc. SPIE: Semiconductor Photodetectors III;6119:10 pages.

\* cited by examiner

*Primary Examiner* — David Porta
*Assistant Examiner* — Faye Boosalis

(57) ABSTRACT

A positron emission tomography apparatus (100) includes a plurality of radiation sensitive detector systems (106) and selective trigger systems (120). The selective trigger systems identify detector signals resulting from detected gamma radiation (310) while disregarding spurious detector signals (310). In one implementation, the apparatus (100) includes a time to digital converter which decomposes a measurement time interval ($T_{max}$) according to a binary hierarchical decomposition of level H, where H is an integer greater than equal to one.

18 Claims, 8 Drawing Sheets

TIME OF FLIGHT MEASUREMENTS IN POSITRON EMISSION TOMOGRAPHY

CROSS REFERENCE TO RELATED APPLICATIONS

Figure 1:
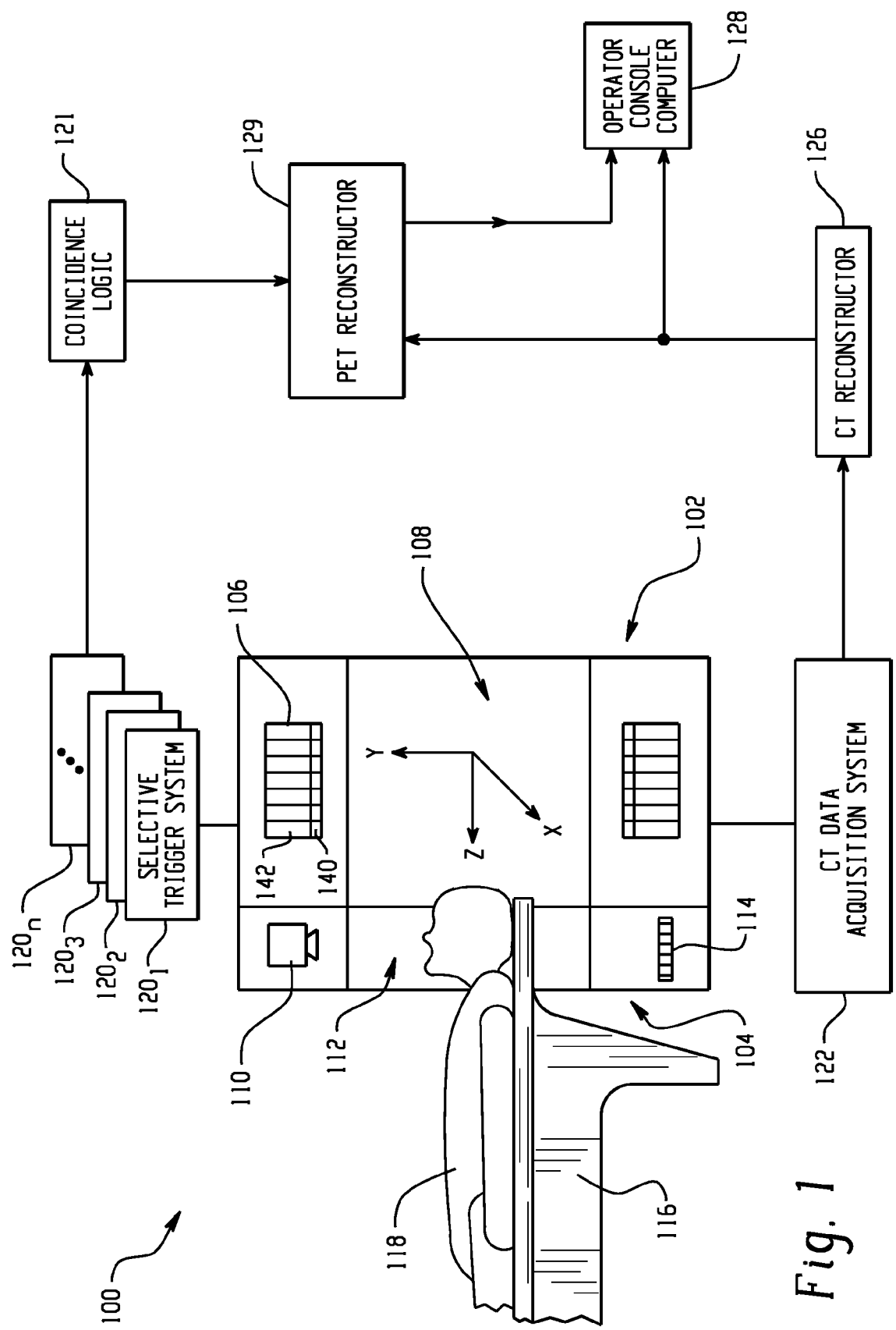

This application claims the benefit of U.S. provisional application Ser. No. 60/820,615 filed Jul. 28, 2006, which is incorporated herein by reference.

The present application relates to positron emission tomography (PET), and especially to detection of coincidence events in time of flight (TOF) PET. It also finds application to non-TOF PET, single photon emission computed tomography (SPECT), and other medical and non-medical applications where it is necessary to detect radiation in the presence of noise.

In positron emission tomography, a positron-emitting isotope is introduced into the body of a human patient or other object under examination. The positrons react with an electron in what is known as a positron annihilation event, thereby generating a coincident pair of 511 keV gamma rays which travel in substantially opposite directions along a line of response (LOR). A gamma ray pair detected within a coincidence time is ordinarily recorded by the PET scanner. In a typical scan, many millions of such annihilation are detected and used to generate images or other information indicative of the distribution of the isotope.

One important application of PET is in medicine, where the information provided by PET scanners is widely used by radiologists and other medical professionals in connection with the diagnosis and treatment of disease. In this regard, it is desirable to provide images having a relatively higher image quality while minimizing the dose applied to the patient and the length of the imaging procedure.

In TOF PET, the actual time difference between the detection of two coincident gamma rays is measured and used to estimate the location of the event along the LOR. The location information can in turn be used in the reconstruction process to improve the quality of the reconstructed image. For a given activity level and imaging time, the additional location information can be used to produce images having an improved image quality compared to non-TOF PET images. Viewed from another perspective, images of comparable quality may be obtained using relatively less dose and/or a relatively shorter scan time.

The performance of a practical PET system is influenced by its sensitivity, its energy and time resolution, time response, and other characteristics of the detector system, and by noise. In commercially available PET systems, an array of photosensors such as photomultiplier tubes (PMTs) is disposed behind a scintillator material. In TOF systems, a relatively fast scintillator material such as LYSO, LSO, or LaBr is used to provide the requisite time resolution. The use of solid state photosensors such as arrays of avalanche photodiodes (APDs) driven in the Geiger mode (GM-APDs) has also been proposed. While they are also characterized by a relatively good time resolution, GM-APDs are also prone to dark counts, which do not originate from photon absorptions. While the dark count rate depends on factors such as the device geometry and process parameters, temperature, and the applied bias voltage, dark counts can have a deleterious effect on the quality of the resultant images.

Consequently, there remains room for improvement. For example, it is desirable to reduce the effects of spurious events resulting from dark counts and other noise sources while improving the accuracy of the timing measurements. In addition to degrading image quality, responding to and processing these spurious events can limit the maximum detector count rate, causing potentially valid counts to be missed. While these effects can be ameliorated by reducing the photosensor bias voltage or raising the event triggering threshold, doing so tends to reduce overall sensitivity and/or the accuracy of the timing measurements. Of course, these matters must also be considered in the context of system complexity, reliability, and cost.

Still another factor which influences the performance of a practical TOF PET system is the time to digital converter (TDC) used to perform the requisite time measurements.

Analog TDCs are typically based on the time constant of a capacitor, which is charged and/or discharged using a constant current source. While analog TDCs can provide measurements having a relatively high time resolution, the requisite analog circuitry, integration capacitors, and voltage to time conversion circuitry limit their attractiveness. Moreover, analog TDCs provide a non-linear response. Although it is possible to compensate for the non-linearity, doing so can increase the conversion time. Where the conversion time exceeds the length of the scintillator pulse, the pixel dead time is increased.

Digital TDCs may be implemented in an advanced CMOS process in which the TDC is integrated with GM-APDs or other digital signal sources. Digital TDCs have also included a ring oscillator and a latch that stores the status of the ring oscillator at the time of an event. However, such designs are typically not shut down between events and thus have a relatively high static high power consumption. Thus, time to digital conversion based on a ring oscillator is not well suited for application in a large scale sensor, especially where a TDC is provided for each detector pixel. Another alternative is the use of tapped delay lines and vernier line TDCs. However, such implementations also tend to be area intensive, and the time resolution can be affected by process variations as well as well as by operating conditions such as ambient temperature and operating voltage.

Yet another TDC technique is the so-called pulse shrinking method. See, e.g., U.S. Pat. No. 6,288,587 to Chen et al., entitled CMOS Pulse Shrinking Delay Element with Deep Subnanosecond Resolution. Such systems typically include one or more pulse shrinking delay elements which decrease the width of the measured pulse by a time dT. In one implementation, an asynchronous counter is used to determine the number of cycles required for the pulse to disappear.

While pulse shrinking can provide a relatively good linearity and low power consumption, the worst case conversion time $T_c$ is a function of the maximum width $T_{max}$ of the pulse to be converted and the timing resolution dT:

$$T_c = \frac{T_{max}^2}{dT}. \qquad \text{Equation 1}$$

For example, if $T_{max}$ is 10 nanoseconds (ns) and dT=10 picoseconds (ps), then the worst case conversion time would be about 10 microseconds (µs). Such long conversion times are unacceptable in TOF PET and other high rate systems.

Consequently, it remains desirable to provide an improved TDC for use in TOF PET and other applications, especially where relatively high time resolution and short conversion times are needed.

Aspects of the present invention address these matters, and others.

In accordance with one aspect, a radiation detection apparatus includes a scintillator, which generates scintillation photons in response to received radiation photons and a photosensor in optical communication with the scintillator. The photosensor generates a photosensor signal in response to the scintillation photons. The apparatus also includes a first signal detector which generates a first output signal if the photosensor signal satisfies a first signal criteria, a second signal detector which generates a second output signal if the photosensor signal satisfies a second signal criteria, and a radiation signal detector which evaluates the first and second output signals to identify photosensor signals indicative of radiation received by the scintillator.

According to another aspect, a method includes the steps of receiving signals from a gamma radiation detector, evaluating the received signals to identify candidate detector signals. The candidate detector signals include detected gamma radiation signals and spurious signals. The method also includes the steps of evaluating the candidate detector signals to identify detected gamma radiation signals and reject spurious signals, and generating an output indicative of at least one of a measured gamma radiation energy and a measured detection time of the identified detector signals.

According to another aspect of the invention, a positron emission tomography apparatus includes a plurality of detector channels. The detector channels include a radiation sensitive detector and means for evaluating an output of the detector to identify candidate detector signals, where the candidate detector signals including detected gamma radiation signals and spurious signals. The detector channels also include means for qualifying the candidate detector signals so as to identify the gamma radiation signals. The apparatus also includes a coincidence detector operatively connected to the detector channels, wherein the coincidence detector identifies qualified detector signals indicative of positron annihilations.

According to another aspect of the invention, an apparatus includes a gamma radiation sensitive detector, first means operatively connected to the radiation sensitive detector for selectively identifying and qualifying candidate detector signals indicative of gamma radiation received by the radiation sensitive detector, and pulse shrinking time to digital converter means operatively connected to the first means for generating time stamp data which identifies a detection time of the qualified detector signals.

According to still another aspect, a time to digital conversion method includes the steps of receiving a signal to be measured and dividing a measurement time period into a plurality of sub-periods, wherein each sub-period includes a width. The method also includes shortening a width of the signal by an amount which corresponds to the width of at least one of the sub-periods, measuring a width of the shortened signal, and using the amount and the measured width to determine the width of the signal.

According to another aspect, an apparatus for measuring the width of a signal includes means for dividing a measurement time period into a plurality of sub-periods, wherein each sub-period includes a width. The apparatus also includes means for shortening a width of the signal by an amount which corresponds to the width of at least one of the sub-periods, means for measuring a width of the shortened signal, and means for using the amount and the measured width to calculate the width of the signal.

Still further aspects of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 2:
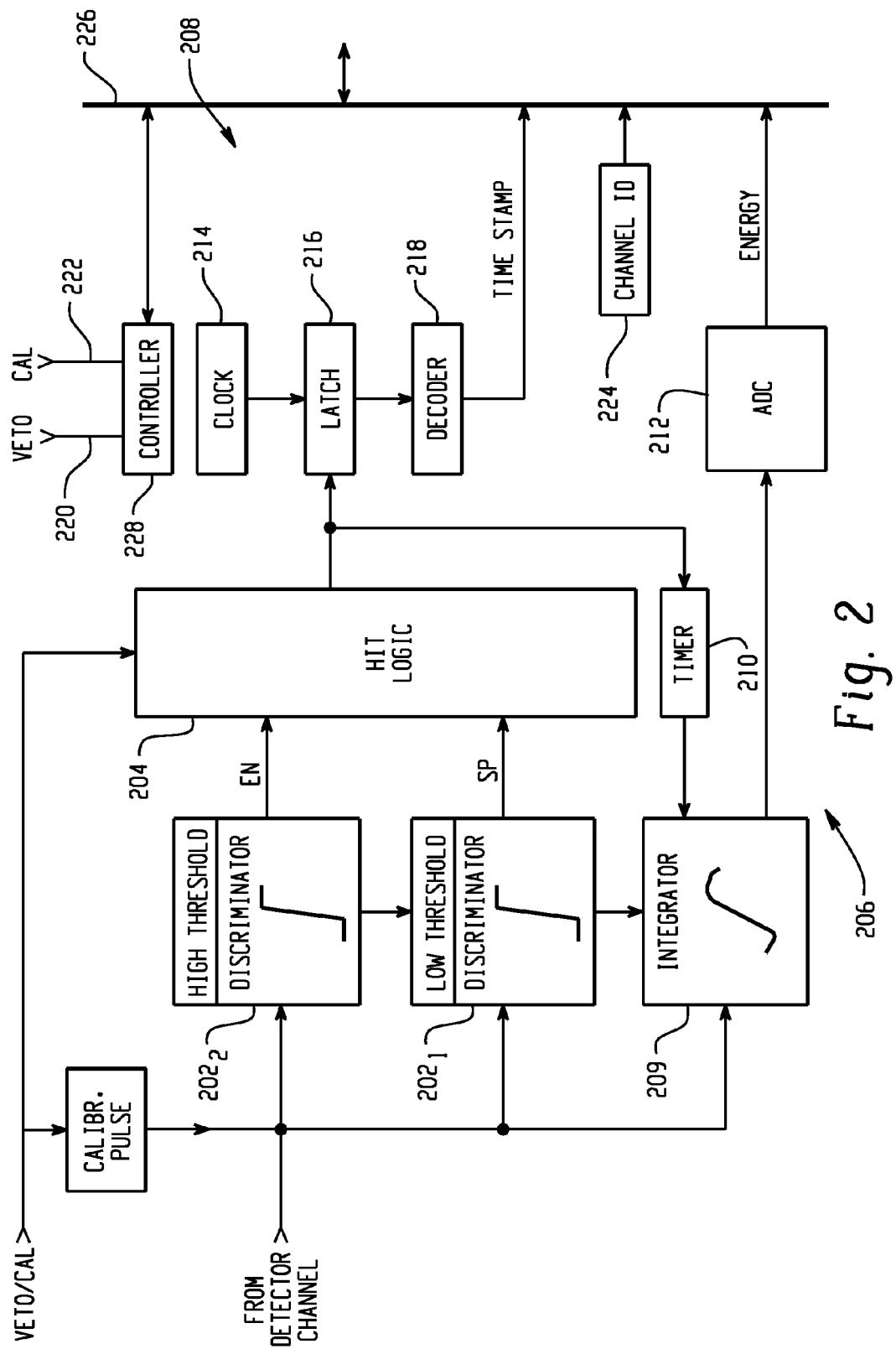
Figure 3A:
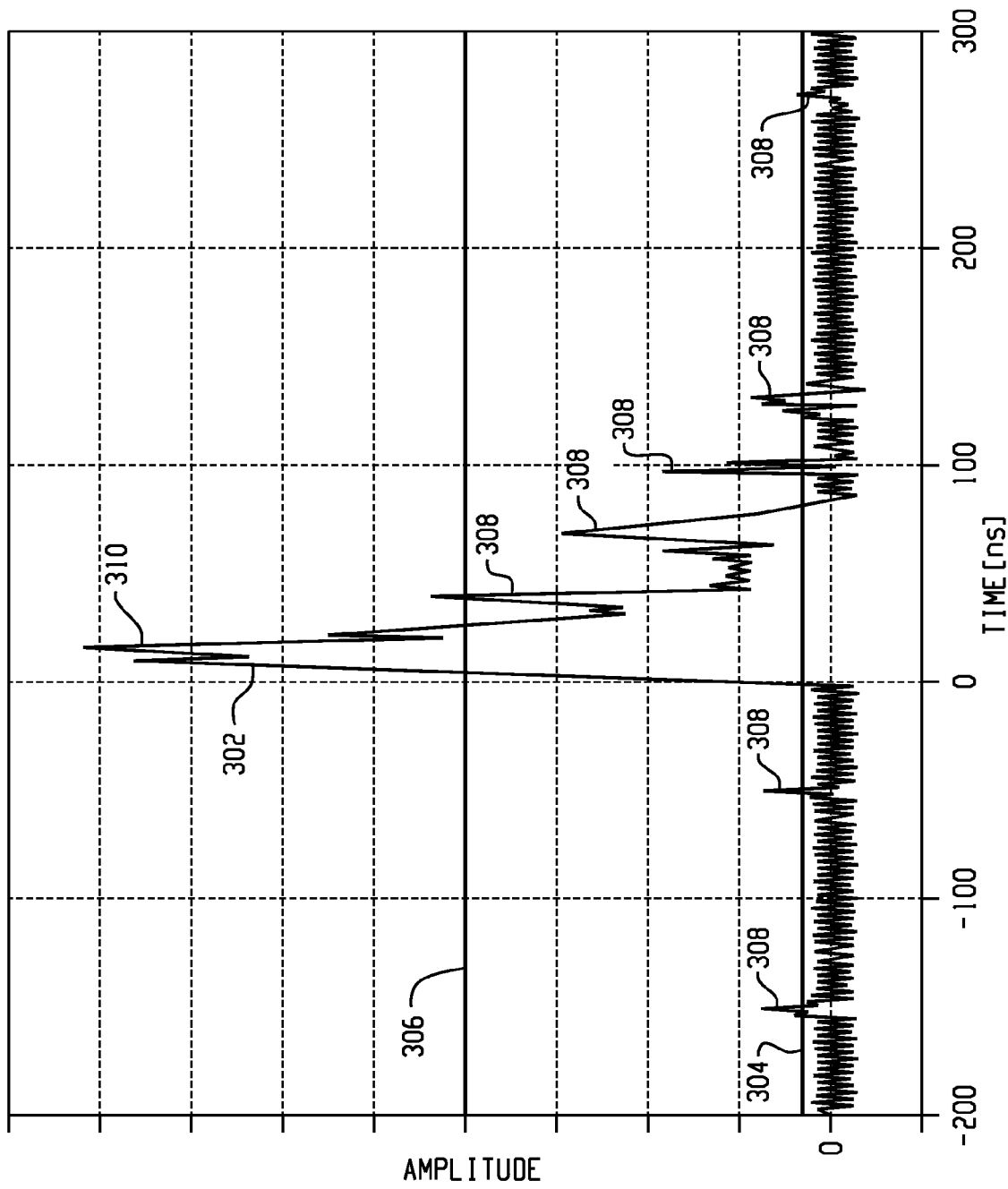
Figure 3B:
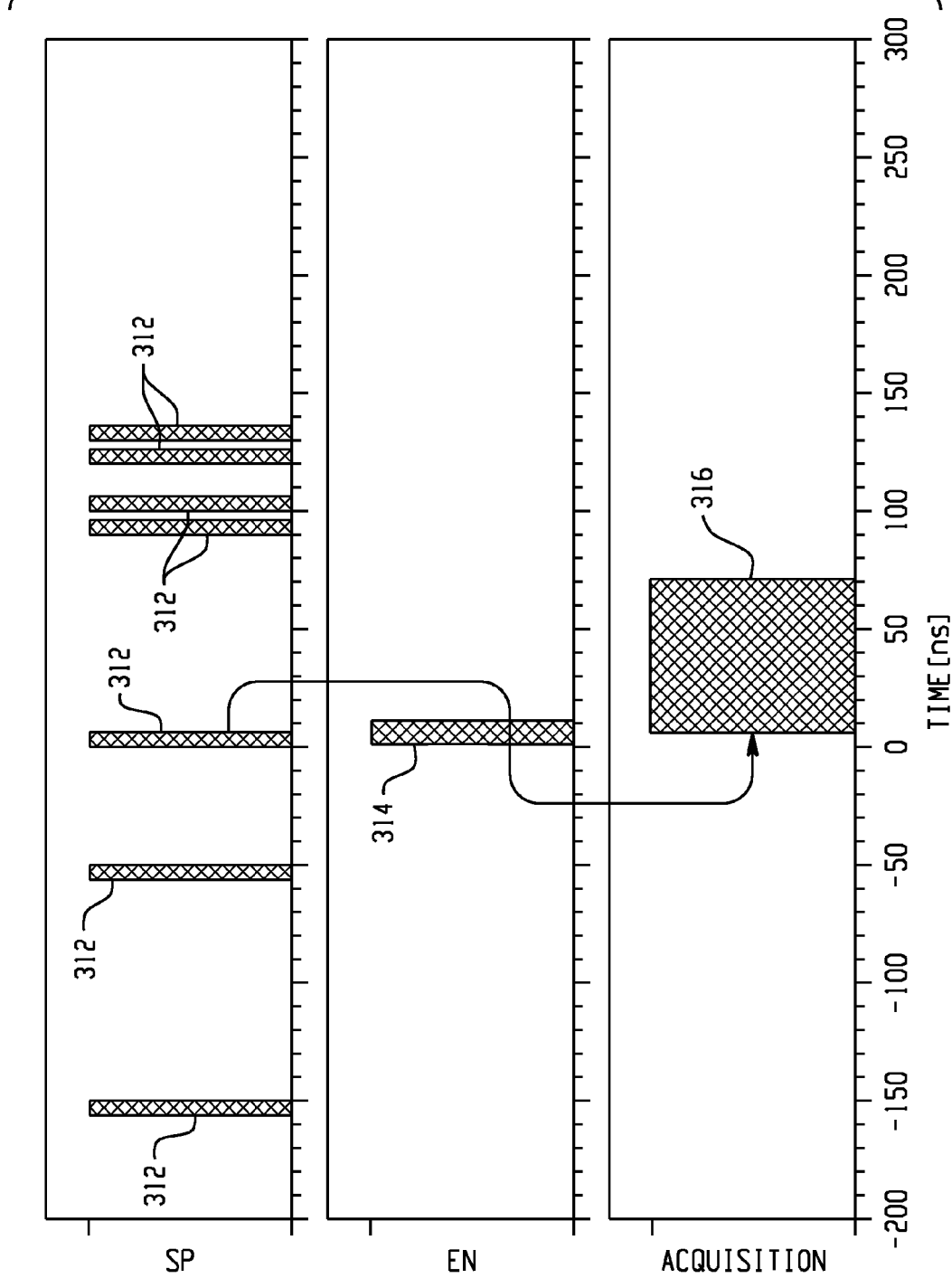
Figure 4:
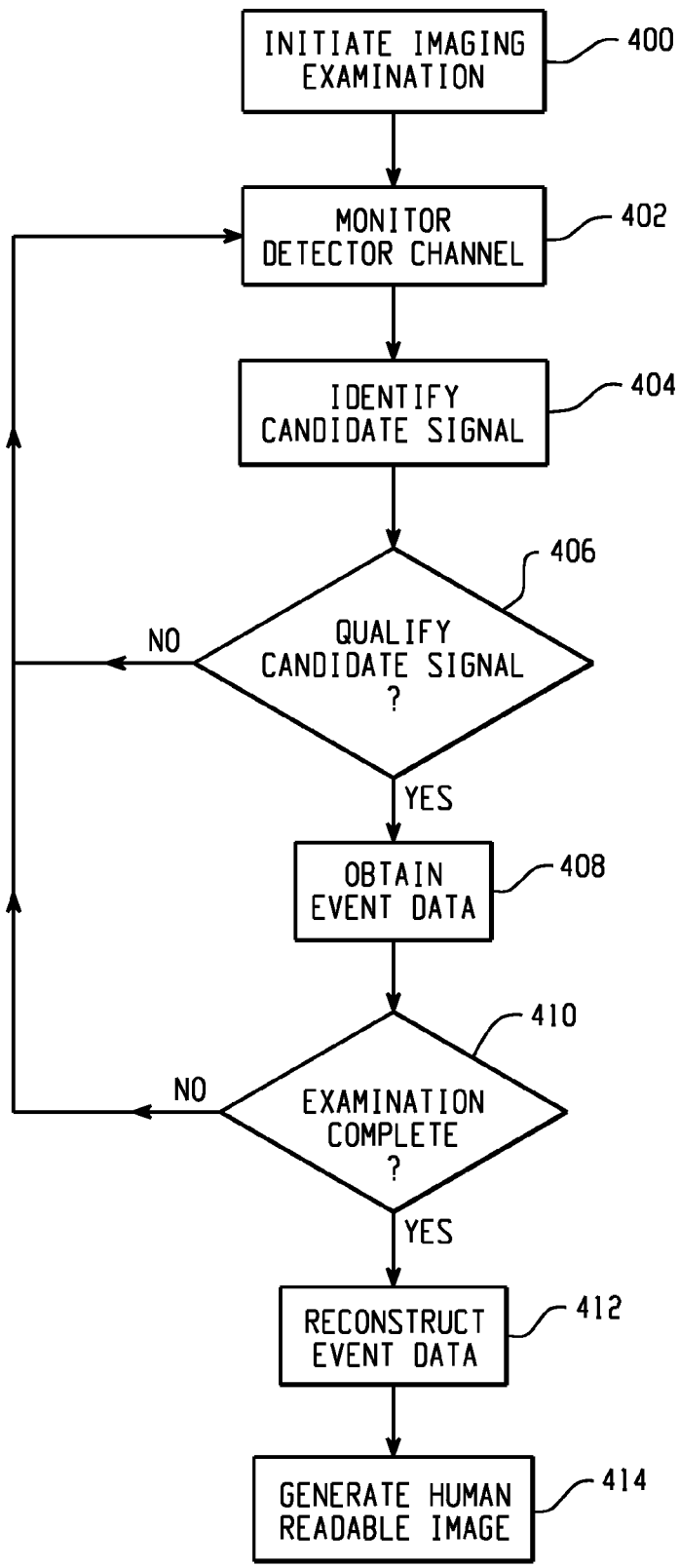
Figure 5:
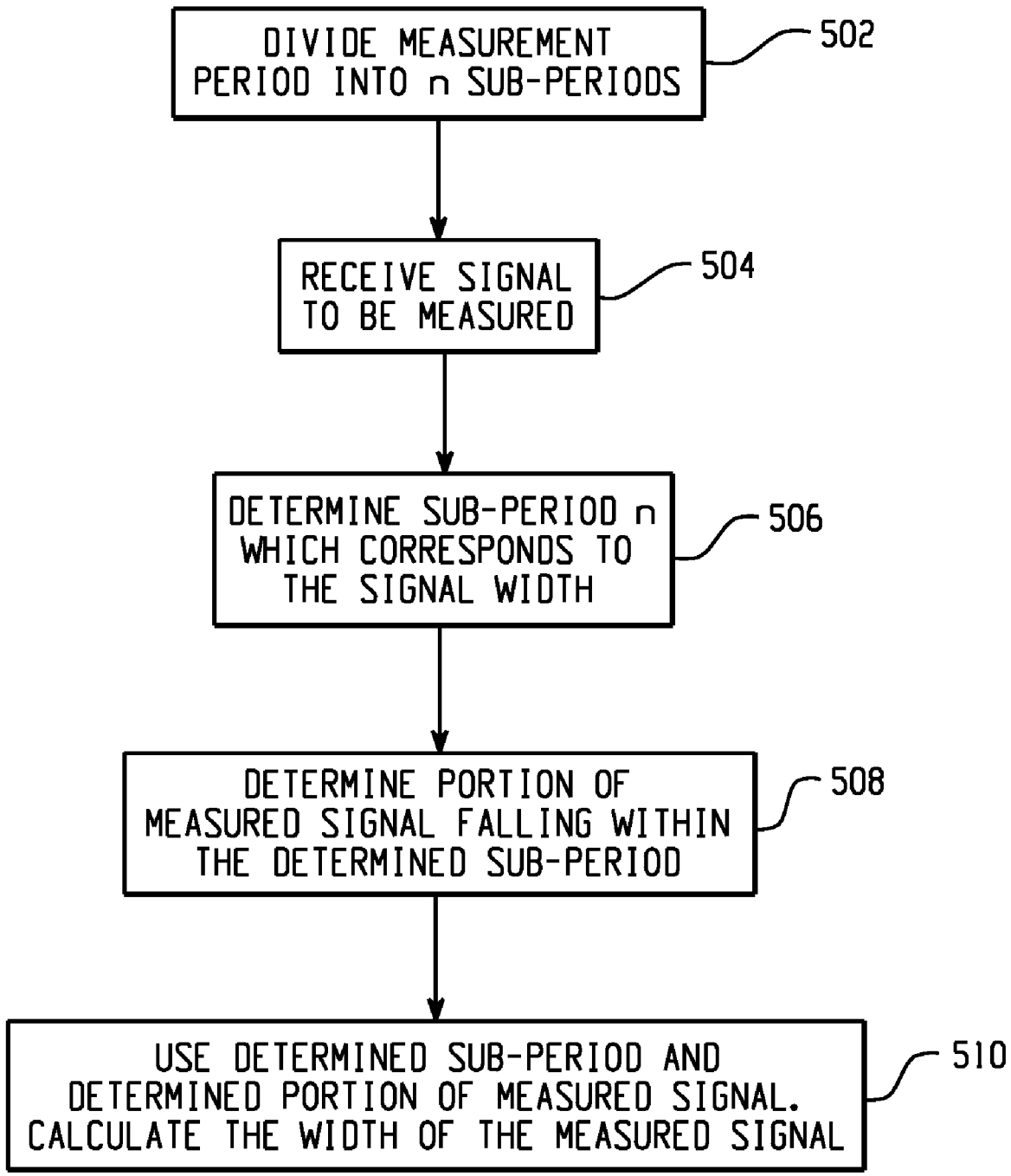
Figure 6:
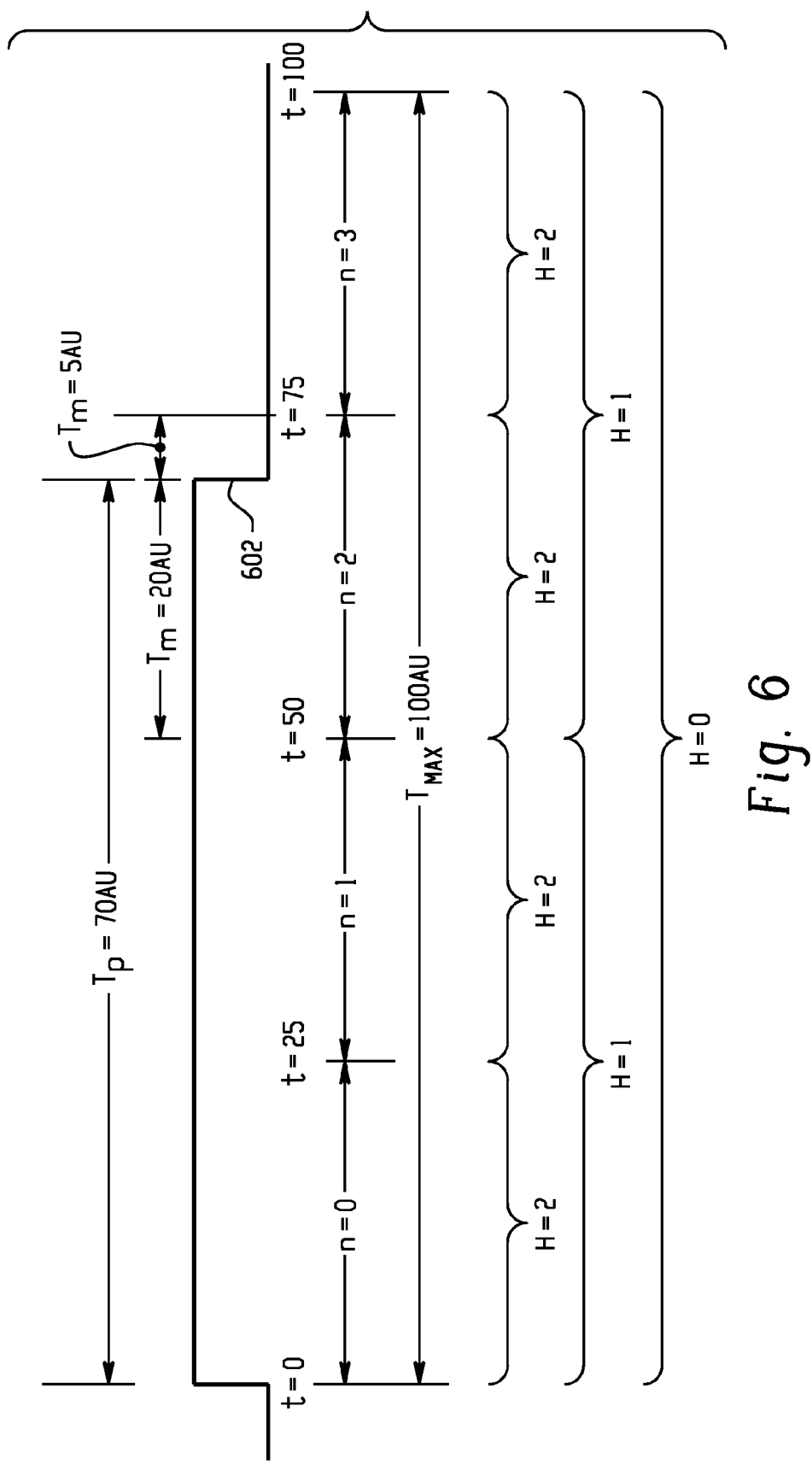
Figure 7:
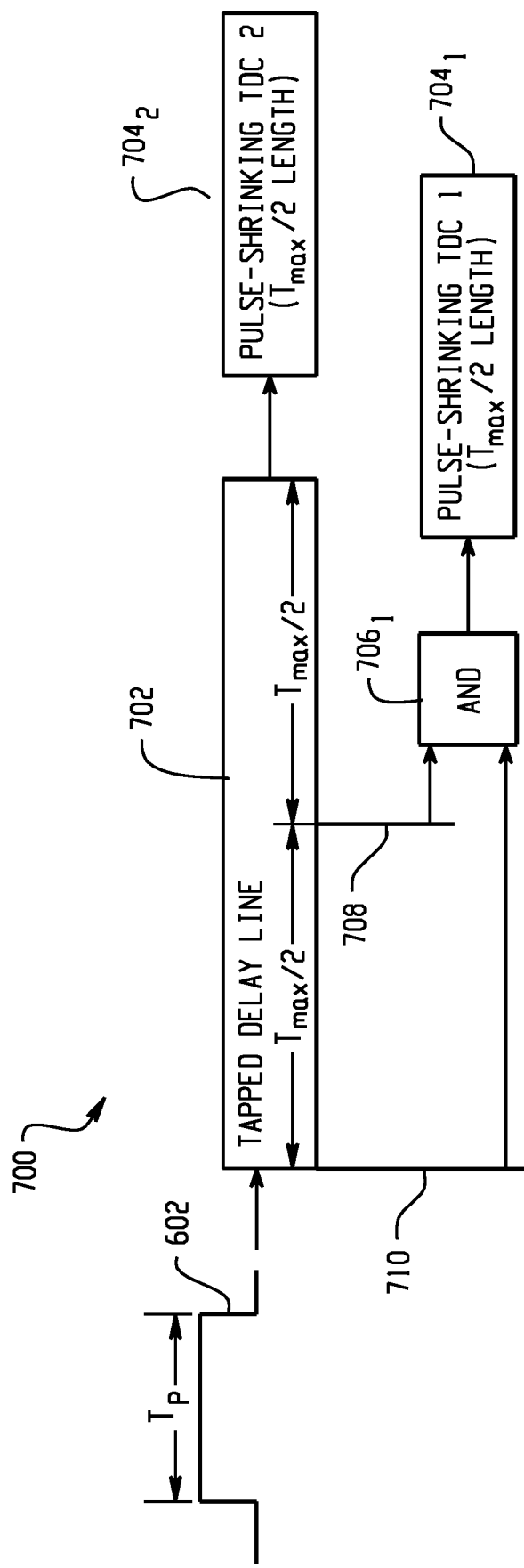

FIG. 1 depicts an imaging system.
FIG. 2 depicts components of a PET data acquisition system.
FIGS. 3A and 3B depict operation of a selective photon triggering system.
FIG. 4 depicts an imaging method.
FIG. 5 depicts a time measurement method.
FIG. 6 depicts a time measurement method.
FIG. 7 is a functional block diagram of a time to digital converter.

With reference to FIG. 1, a combined PET/CT system 100 includes a PET gantry portion 102 and a CT gantry portion 104. The PET gantry portion 102 includes one or more axial rings of radiation sensitive detectors 106 which surround an examination region 108. The detectors 106 include a scintillator material 140 which generates photons in response to gamma photons received at a radiation sensitive face thereof. Photosensors 142 in optical communication with the scintillator 140 generate electrical signals in response to the generated photons. Hence, the detector 106 generates output signals indicative of detected gamma radiation. While the number and configuration of the detectors 106 is a function of the overall system design and other application specific requirements, it will be appreciated that a typical PET system may include on the order of $10^4$ detector channels.

The CT portion 104 includes a radiation source 110 such as an x-ray tube which rotates about a CT examination region 112. Radiation sensitive detectors 114 detect radiation emitted by the x-ray source which has traversed the examination region 112.

The PET gantry portion 102 and CT gantry portion 104 are preferably located in proximity with their respective examination regions 108, 112 disposed along a common longitudinal or z-axis. An object support 116 supports an object to be imaged 118 such as a human patient. The object support 116 is preferably longitudinally movable in coordination with operation of the PET/CT system 100 so that the object 118 can be scanned at a plurality of longitudinal locations by both the PET and CT gantry portions 102, 104 according to a desired scanning trajectory.

A CT data acquisition system 122 processes the signals from the CT detectors 114 to generate data indicative of the radiation attenuation along a plurality of lines or rays through the examination region 112. A CT reconstructor 126 reconstructs the data using suitable reconstruction algorithms to generate volumetric image data indicative of the radiation attenuation of the object 118.

As will be described in greater detail below, a PET data acquisition system includes a plurality of selective photon trigger systems $120_1, 120_2, 120_3 \ldots 120_n$. The trigger systems 120, which are operatively connected to respective detector channels, serve to preferentially identify those valid detector signals resulting from detected radiation, while disregarding those signals which are more likely to result from factors such as noise. In illustrated embodiment, the trigger systems 120 also generate signals indicative of the time, energy, and position of the detected event. Coincidence logic 121 identifies gamma ray pairs which are detected in coincidence and thus are representative of annihilations.

A PET reconstructor 129 processes the annihilation data to generate volumetric data indicative of the distribution of the radionuclide in the object 118, for example using a suitable iterative or analytical reconstruction algorithm. In the case of the illustrated hybrid PET/CT system 100, the PET reconstructor 129 uses information from the CT system to apply attenuation and other desired corrections to the PET data.

A workstation computer serves an operator console 128. The console 128 includes a human readable output device such as a monitor or display and input devices such as a keyboard and mouse. Software resident on the console 128 allows the operator to view and otherwise manipulate the volumetric image data generated by the PET and CT reconstructors 129, 126. Software resident on the console 128 also allows the operator to control the operation of the system 100 by establishing desired scan protocols, initiating and terminating scans, and otherwise interacting with the scanner 100.

Variations on the system 100 are also contemplated. Thus, for example, the CT portion of the scanner may be omitted, located remotely from the PET gantry portion 102, or replaced with another modality such as a magnetic resonance (MR) scanner. Attenuation or anatomical information may also be generated using a transmission source associated with the PET gantry portion 102 or obtained from another source.

FIG. 2 depicts an exemplary selective photon trigger system 120. As illustrated, the triggering system 120 implements a multiple level triggering system including first $202_1$ and second $202_2$ signal detectors or discriminators, the inputs of which are operatively connected to one or more detector channels. The signal detectors 202 generate respective trigger output signals when their respective input conditions are satisfied. As illustrated, the first signal detector $202_1$ is implemented as a level detector having a first relatively low threshold value. The second signal detector $202_2$ is likewise implemented as a level detector having a second relatively higher threshold value. While a dual level triggering system is shown, it will be understood that still additional signal detectors 202 and hence triggering levels may be provided. Triggering conditions other than level (e.g. rate of change or the integral of the detector signal) are also contemplated, either alone or in combination with level detection.

In the illustrated implementation, which is particularly well suited for use in connection with TOF PET systems where accurate detection time measurement is especially important, the threshold value of the first signal detector $202_1$ is set to a level which corresponds to the expected signal generated by the $k^{th}$ discrete photon of a scintillation. In one implementation, the first threshold is set to a value which corresponds to the first photon, although the threshold may be set to detect second or other temporally succeeding photons. Also, the trigger generation might not be done with a conventional level detector, but may be derived from the scintillation photons in a different manner, e.g., by realizing a first-photon trigger using a GM-APD (or multi-pixel GM-APD). Triggering on the signals evoked by the initial scintillation photons after the detection of a radiation photon can ordinarily be expected to improve the accuracy of the time measurement, especially where the time variation or jitter between detection of the radiation photon and the generation of a detector 106 output signal is relatively small. On the other hand, doing so tends to make the first signal detector $202_1$ more sensitive to noise or other spurious events. Thus, the threshold value of the second signal detector $202_2$ is set to a level which can be used to confirm or qualify the possible events identified by the first signal detector $202_1$ as most likely resulting from a valid photon signal. In this sense, then, the first trigger signal can be considered as a candidate or single photon trigger signal, and the second trigger can be considered as a qualifying or enabling photon trigger signal.

Hit or trigger logic 204 evaluates the trigger output signals from the signal detectors 202 according to one or more acceptance criteria to identify those detector signals which are likely to result from valid detector signals, while disregarding those that are more likely to result from noise or other factors. One suitable acceptance criteria is to determine whether a candidate photon trigger signal is followed by a qualifying photon trigger signal within an acceptance time window. If so, the detector signal is treated as a valid detector signal. If not, the detector signal is discarded, for example by marking it as invalid.

The output of the trigger logic 204 is in turn connected to an energy measurement system 206 and a time measurement system 208. The energy measurement system 206 generates an output indicative of the energy of the detected gamma photon. As illustrated in FIG. 2, the energy measurement system 206 includes an integrator 209, a timer 210, and an analog to digital converter 212. Upon receiving a valid detector signal from the trigger logic 204, the timer 210 causes the integrator 209 to integrate the detector signal for the desired integration time period. As will be appreciated by those of ordinary skill in the art, the output of the integrator 209 is representative of the energy of the detected gamma photon. The integrator 209 output is in turn digitized by the analog to digital converter (ADC) 212.

The time measurement system 208 such as a time to digital converter (TDC) generates a time stamp data indicative of the time at which the gamma was detected. As illustrated in FIG. 2, the time measurement system 208 includes a high speed DLL clock 214, a latch 216, and a decoder 218. Upon receiving a valid detector signal from the trigger logic 204, the latch 216 latches the then-current value of the clock 214. The clock value is decoded by the decoder to generate a photon time stamp.

A channel identifier 224 is used to identify the particular channel. As will be appreciated, the channel information can be used to identify the physical location of the associated detector channel and hence to establish the coordinates of relevant LORs.

An input/output bus 224 provides a communication interface between the trigger system 120 and the remainder of the PET data acquisition system. More particularly, the bus 224 is used to communicate information such as time stamps, energy levels, channel identifiers, and the like associated with a given detector signal. The bus 224 can also be used to provide requisite control information for controlling the operation of the trigger system 120, providing desired settings 120, or the like.

A veto or disable input 220 is used to disable the data acquisition as required. In one implementation, the data acquisition is disabled in coordination with operation of the hybrid scanner. In the case of a hybrid PET/MR system, for example, the time varying gradient magnetic fields and other signals generated in connection with the magnetic resonance excitation and detection process may render the detector signals unreliable. Consequently, it may be desirable to disable the PET data acquisition in coordination therewith. The veto input 220 (or another input) may also be used to force the conversion of selected channels to implement a neighbor-logic by realizing a regional common trigger scheme. For example, it may be desirable to read out a certain number of neighbors of a channel which has triggered, although these neighbors themselves might not have produced a trigger signal.

A calibration input 222 is used to calibrate the trigger system 120, for example by calibrating the energy 206 and timing 208 measurement systems, detector 220 thresholds, and the like. The actual calibration of the trigger thresholds can be obtained by varying the thresholds in the course of a calibration. The energy measurement systems 208 may also be calibrated by varying the length and/or the amplitude of the calibration pulse. While the veto 220 and calibration 222 are illustrated as discrete inputs, it will be appreciated that suitable control signals may also be provided via the input output bus 226.

A controller 228 controls the operation of the trigger system 120. The controller can be used to supply the detectors 202 with triggering thresholds or other relevant operating parameters, bias currents for controlling the high speed clock, and the like. The controller 228 can also be used to perform functions such as power up initialization, self-tests and diagnostics, communications over the bus 226, and the like.

The trigger systems 120 may be implemented based on discrete or integrated electronics, or a combination thereof. Due to the relatively high number of channels, however, the trigger systems 120 are advantageously implemented using one or more application specific integrated circuits (ASICs). Circuitry 120 associated with multiple channels may be implemented in a common ASIC.

Operation of the level detectors 202 and the trigger logic 204 in relation to a an exemplary detector signal will now be further described with reference to FIG. 3. FIG. 3A shows a signal 302 generated by a detector channel which includes a GM-APD photosensor 142 in optical communication with a LYSO scintillator 140. The abscissa represents time in nanoseconds (ns) and the ordinate represents the amplitude of the detector signal. The threshold value of the first signal detector $202_1$ is shown at 304. The threshold value of the second signal detector $202_2$ is shown at 306.

The signal 302 includes noise signals 308 resulting from dark counts or other noise. The signal 302 also includes a signal 310 resulting from a 511 keV scintillation event. As can be seen, the signal 310 is characterized by a relatively fast rise time, followed by a generally exponential decay. Those noise signals 308 which exceed the first level threshold 304 are detected by the first signal detector $202_1$, which generates a corresponding single photon (SP) or potential photon trigger signal. Signals such as a valid scintillation signal 310 which exceed the second threshold 306 are detected by the second signal detector $202_2$, which generates a qualifying or enable (EN) trigger signal.

With additional reference to FIG. 3B, upon receiving a potential photon trigger signal from the first signal detector $202_1$, the trigger logic 204 opens an acceptance time window 312. As illustrated, the acceptance time window is approximately 5 ns, although other windows may be implemented depending on the characteristics of a particular detector system or other application specific requirements. If no enable trigger signal is received within the acceptance time window 312, the detection signal is assumed to result from a noise signal 308. If, on the other hand, a qualifying signal 314 is received during an acceptance time window, the signal 310 is considered to be a valid photon signal. The noise signals 308 received during the decay time of the scintillator can result from fluctuations of the scintillation signal, dark counts, or other noise. These signals are also ignored, because they do not cross the low threshold level, or, if they do, no enable trigger is received within the corresponding acceptance window.

Note that the various thresholds and time windows may be dynamically variable. For example, the width of the acceptance time window may be varied as a function of the rise time of the signal 302 (e.g., by measuring the time difference between the detection and enable signals).

In the case of a valid photon, the end or termination of the acceptance window 312 is used by the energy measurement system 206 and the time measurement system 208 to initiate the data acquisition process as illustrated generally at 316. In one implementation, the trigger logic 204 causes the latch 216 to latch the current clock value, which serves as a time stamp for the detected gamma. Similarly, the trigger logic 204 initiates the integration of the detector signal so as to measure the energy of the detected gamma. A particular advantage of using the end of the acceptance time window 312 to initiate the data acquisition process is its ease of implementation, especially where the acceptance time window 312 has a constant value. The data acquisition can be initiated in other ways, for example by a signal derived from the potential photon trigger signal, and especially by a derived signal which has a known temporal relationship to the trigger signal.

In another implementation, the latch 216 latches or marks the time stamp upon receipt of potential photon trigger signal. If an enable photon trigger signal is received within the acceptance time window 312, the trigger logic 204 causes the event to be marked as valid and the time stamp retained. Otherwise, the time stamp is discarded, for example by marking the time stamp or the corresponding event as invalid. The potential photon trigger signal may likewise be used to initiate the energy measurement process, in which case the energy measurement is retained only if an enable photon trigger signal is received within the acceptance time window. Such an implementation is particularly well suited to situations in which the acceptance time window 312 has a variable width, such as in the case of a dynamically variable acceptance time window as described above.

An imaging method will now be described in relation to FIG. 4.

At 400, a PET or other desired examination is initiated.

At 402, the signal 302 from the detector channel is monitored.

At 404, a candidate signal which potentially results from a valid photon is identified, for example by identifying a signal which exceeds the first threshold 304.

At 406, the candidate signal is qualified, for example by determining whether the signal 302 exceeds the second threshold 306 within an acceptance time window 312. If not, the process returns to step 402.

If so, the time stamp, energy, channel location, and/or other desired event data is obtained at step 408. As noted above, some or all of the event data may be measured prior to qualifying the signal as indicative of a detected photon.

At step 410, the detector channel is monitored until the examination is complete.

At step 412, the event data is reconstructed to generate volumetric or volume space data indicative of the detected events. While the method steps 402-408 were described in relation to monitoring a single detector channel for clarity of explanation, those of ordinary skill in the art will recognize that a plurality of detector channels would ordinarily be monitored, with the data from the various channels being used in the reconstruction process.

At step 414, one or more human readable images indicative of the volume space data are generated.

Various alternatives are contemplated. For example, the foregoing techniques are also applicable to non-TOF PET, single photon emission computed tomography (SPECT), and other medical and non-medical applications which require accurate signal detection in the presence of noise. The techniques are also more generally applicable to pulse or signal detectors which acquire time stamp data. Examples include the detection of ionizing or non-ionizing radiation, for example in high energy physics experiments which measure a time of flight between a reference trigger and detected scintillation pulses (showers), and laser range finding.

Depending on application specific requirements, one or both of the energy and time stamp measurements may be omitted. Still other measurements may be provided.

While the accuracy of the timing measurement generally benefits from detectors having a relatively fast time response and relatively low timing jitter, other detectors and detector configurations are contemplated depending on the speed, sensitivity, energy, and other requirements of a particular application. APDs, for example, may be operated other than in the Geiger mode. The photosensors 140 may also be implemented using photomultiplier tubes (PMTs), multi-anode PMTs, or other light sensitive devices. Other scintillator 142 materials including but not limited to LSO, LaBr, GSO, and BGO may be used. As still another alternative, semiconductor and other direct conversion detectors may be used.

Moreover, the energy 206 and time 208 measurement systems may be implemented using other suitable techniques. One alternate implementation of the time measurement system 208 uses a hierarchical pulse width reduction technique to shorten the width of the pulse or signal to be measured. Pulse width reduction is especially well-suited to pulse shrinking or other time measurement techniques in which the conversion time is a function of the maximum pulse width.

Such a method will now be described with relation to FIGS. 5 and 6. At 502, a measurement period $T_{max}$ which corresponds to the maximum expected width of a signal to be measured is divided in to N sub-periods, where N is an integer greater than one. While the sub-periods may be of arbitrary number and length, the number N of sub-periods is advantageously established according to the relationship:

$$N=2^x.$$ Equation 2 where x is an integer greater than or equal to one. Similarly, the width $T_w$ of the sub-periods may be established according to the relationship:

$$T_w = \frac{T_{max}}{N}.$$ Equation 3

Viewed from another perspective, the division of the measurement period can be expressed as a multilevel hierarchical decomposition of the measurement period $T_{max}$ into H levels, where H is an integer greater than or equal to 1.

A non-limiting example of such an arrangement is illustrated in FIG. 6, in which a measurement period $T_{max}$ has a width of 100 arbitrary time units (AU). As illustrated, the measurement period is divided into four (4) sub-periods n, each having a width of 25 AU. Viewed from another perspective, the subdivision can be viewed as a two (2) level binary hierarchical decomposition (i.e., H=2) of the measurement period.

A signal to be measured 602 having an arbitrary time width $T_p$ is received at 504. In the example of FIG. 6, the measured signal has a width $T_p$ of 70 AU.

At 506, a gross time measurement is performed to determine the sub-period n which corresponds to the measured signal width $T_p$. Stated another way, the measured signal width is reduced by an amount which corresponds to the width of one or more sub-periods. In the illustrated example, the measured signal width $T_p$ falls within the third sub-period (i.e., n=2).

At 508, the portion $T_m$ of the measured signal 602 falling within the determined sub-period is measured. In one implementation, the width is measured using a pulse shrinking technique. As shown in FIG. 6, the measured portion $T_m$ is 20 AU from the beginning of the third sub-period. Viewed from an alternate perspective, the measured portion $T_m$ is 5 AU from the end of the third sub-period.

At 510, the determined sub-period n and determined portion $T_m$ are used to calculate the measured signal width $T_p$. Where the sub-periods have an equal width, the measured signal width $T_p$ can be determined according to the relationship:

$$T_p=((n-1)\times T_w)+T_m$$ Equation 4 where $T_m$ is expressed from the beginning of sub-period. In the example of FIG. 6, the measured signal width $T_p$ is thus $((2-1)\times 25)+20=70$ AU. Equation 5 expresses the measured signal width $T_p$ with respect to the measurement period $T_{max}$:

$$T_p=T_{max}-((N-n)\times T_w)+T_m$$ Equation 5 where $T_m$ is again expressed from the beginning of the sub-period. Equations 4 and 5 can be readily generalized in the case of sub-regions having unequal widths or where $T_m$ is expressed from the end of the sub-period.

As will be appreciated, the described technique reduces the conversion time by a factor of $4^H$ relative to a conventional pulse shrinking converter.

FIG. 7 depicts an exemplary TDC system 500 in which N=2, $T_w=0.5\times T_{max}$, and H=1. As illustrated, the TDC system 700 includes a tapped delay line 702, first 704₁, and second 704₂ time to digital converters, and a first logical AND function 706₁.

The delay line 702 has a width $T_{max}$ and is tapped at a point 708 which corresponds to time $T_{max}/2$, or one-half the maximum pulse width. The first logical AND function 706₁ is connected to the input 710 of the delay line and to the midpoint 708.

The time to digital converters 704 are pulse shrinking TDCs designed for pulses having a maximum length $T_{max}/2$. The first time to digital converter 704₁ is connected to the output of the first AND function 706. The second time to digital converter is connected to the output of the delay line 702.

In one implementation, the pulse shrinking converters 704 include a feedback delay line containing an asymmetric inverter. The asymmetric inverter has slightly different rise and fall times, thus decreasing the input pulse width by a time dT. An asynchronous counter counts the number of cycles the pulse needs to disappear. Note that other suitable time digital converter implementations, pulse shrinking or otherwise, may also be used.

In operation, the measured signal 602 having an unknown width $T_p$ is received at the input 710 of the delay line 702. If the signal 602 has a width greater than $T_{max}/2$ (i.e., n=1), a shortened pulse having a width $T_p-T_{max}/2$ will be sent to the first time to digital converter 704₁ and its output used to determine $T_m$. If the pulse is shorter than $T_{max}/2$ (i.e., n=0) the first time to digital converter 704₁, the second time to digital converter 704₂ will receive the shortened pulse, and its output will be used to determine $T_m$. Note that the arithmetic functions and various control functions used to perform the requisite calculations are omitted for clarity of illustration. While illustrated as having two sub-periods, three or more sub-periods may also be implemented.

As the sub-regions are non-overlapping, the illustrated system 700 will exhibit a piece-wise linear response for sub-regions $T_p<0.5T_{max}$ and $T_p>0.5T_{max}$. However, differences between the converters 704, as well as the effect of the delay line 702 and the AND function 706 can effect the matching of the sub-regions, for example leading to a mismatch at the crossover point between sub-regions and different gains or slopes in the different sub-regions. In a post-measurement correction scheme, the required offset and gain corrections for the various sub-regions are stored in a calibration table or otherwise in a suitable memory. In a delay equalization correction scheme, the gain(s) can be calibrated by adjusting the time resolution dT of the various converters 704. The offset(s) between sub-regions can be corrected by inserting adjustable delay elements into the delay line. The delay elements are adjusted to provide a common crossover point between the desired sub-regions.

As illustrated in FIG. 7, one converter 704 is used at each level H of the hierarchical decomposition. The number or converters 704 may be reduced by multiplexing the converters among the various sub-regions, for example by using one converter 704 per hierarchy level and multiplexing the converters accordingly. Moreover, the various levels hierarchy can be implemented on the same delay line, thus reducing its area requirement.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A radiation detection apparatus comprising:
   a scintillator which generates scintillation photons in response to received radiation photons;
   a photosensor in optical communication with the scintillator and which generates photosensor signals in response to the scintillation photons;
   a first signal detector which generates a first output signal if a photosensor signal satisfies a first signal criteria, wherein the first signal criteria identifies the photosensor signal as indicative of temporally initial scintillation photons generated by the scintillator in response to the received radiation photons;
   a second signal detector which generates a second output signal if the photosensor signal alternatively satisfies a second signal criteria, wherein the second signal criteria identifies the photosensor signal as indicative of temporally subsequent scintillation photons generated by the scintillator in response to the received radiation photons; and
   a radiation signal detector which evaluates the first and second output signals to determine if the second output signal has been received within an acceptance time window, wherein receiving the first output signal defines a starting point of the acceptance time window, and if the second output signal is received within the acceptance time window, the radiation signal detector identifies photosensor signals indicative of radiation received by the scintillator; and if the second output signal is not received within the acceptance time window, the radiation signal detector does not identify photosensor signals indicative of radiation received by the scintillator.

2. The apparatus of claim 1 wherein the first signal criteria includes a first level threshold and the second signal criteria includes a second level threshold, and wherein the magnitude of the second threshold is greater than the magnitude of the first threshold.

3. The apparatus of claim 1 wherein the photosensor generates dark counts and wherein the radiation signal detector rejects photosensor signals resulting from dark counts generated by the photosensor.

4. The apparatus of claim 1 wherein the radiation signal detector determines whether a second output signal is generated within an acceptance time window following the generation of a first output signal.

5. The apparatus of claim 1 further including a time measurement system operatively connected to the radiation signal detector, wherein the time measurement system generates time stamps indicative of the identified photosensor signals.

6. The apparatus of claim 5 wherein the time stamp is the time at which the photosensor output signal satisfies the first signal criteria.

7. The apparatus of claim 5 wherein the time measurement system includes pulse width reduction means for shortening a width of a measured pulse.

8. The apparatus of claim 7 further including a pulse shrinking time to digital converter which measures a width of the shortened pulse.

9. The apparatus of claim 1 further including an energy measurement system operatively connected to the radiation signal detector, wherein the energy measurement system measures the preferentially identified photosensor output signals so as to generate a signal indicative of received radiation photons.

10. The apparatus of claim 1 further including a TOF PET system.

11. A method comprising:
    generating scintillation photons in response to received radiation photons;
    generating a photosensor signal in response to the scintillation photons;
    generating a first output signal if the photosensor signal satisfies a first signal criteria, wherein the first signal criteria identifies a photosensor signal indicative of temporally initial scintillation photons generated by the scintillator in response to the received radiation photons;
    generating a second different output signal if the photosensor signal satisfies a second different signal criteria, wherein the second signal criteria identifies a photosensor signal indicative of temporally subsequent scintillation photons generated by the scintillator in response to the same received radiation photons; and
    evaluating the first and second output signals to determine if the second output signal has been received within an acceptance time window, wherein receiving the first output signal defines a starting point of the acceptance time window, and if the second output signal is received within the acceptance time window, identifying photosensor signals indicative of radiation received by the scintillator; wherein if the second output signal is not received within the acceptance time window, not identifying photosensor signals indicative of radiation received by the scintillator.

12. The method of claim 11 wherein the radiation detector includes an avalanche photodiode operating in the Geiger mode and wherein the spurious signals include dark counts generated by the avalanche photodiode.

13. The method of claim 11 wherein the detected gamma radiation includes gamma photons indicative of positron annihilations.

14. The method of claim 11 including:
    measuring a characteristic of a candidate signal;
    using the measured characteristic to adjust the second threshold.

15. The method of claim 11 wherein the first threshold value also corresponds to a detector noise output.

16. The method of claim 11 wherein evaluating the candidate detector signals includes establishing an acceptance time window following identification of the candidate signal;

evaluating a characteristic of the detector signal during the acceptance time window.

17. The method of claim 16 wherein the acceptance time window is about 5 ns.

18. A positron emission tomography apparatus comprising:

means for generating scintillation photons in response to received radiation photons;

means for generating a photosensor signal in response to the scintillation photons;

means for generating a first output signal (SP) if the photosensor signal satisfies a first signal criteria, wherein the first signal criteria identifies a photosensor signal indicative of temporally initial scintillation photons generated by the scintillator in response to a received radiation photon;

means for generating a second output signal (EN) if the photosensor signal satisfies a second signal criteria, wherein the second signal criteria identifies a photosensor signal indicative of temporally subsequent scintillation photons generated by the scintillator in response to the received radiation photon; and means for evaluating the first and second output signals to determine if the second output signal has been received within an acceptance time window, wherein receiving the first output signal defines a starting point of the acceptance time window, and if the second output signal is received within the acceptance time window, identifying photosensor signals indicative of radiation received by the scintillator; wherein if the second output signal is not received within the acceptance time window, not identifying photosensor signals indicative of radiation received by the scintillator.

* * * * *